United States Patent
Ding et al.

(10) Patent No.: US 10,353,408 B2
(45) Date of Patent: Jul. 16, 2019

(54) SYSTEM FOR AND METHOD OF FAST PULSE GAS DELIVERY

(75) Inventors: Junhua Ding, Boxborough, MA (US); Michael L'Bassi, Sterling, MA (US); Tseng-Chung Lee, Lexington, MA (US)

(73) Assignee: MKS Instruments, Inc., Andover, MA (US)

( * ) Notice: Subject to any disclaimer, the term of this patent is extended or adjusted under 35 U.S.C. 154(b) by 988 days.

(21) Appl. No.: 13/344,387

(22) Filed: Jan. 5, 2012

(65) Prior Publication Data

US 2012/0216888 A1    Aug. 30, 2012

Related U.S. Application Data

(63) Continuation-in-part of application No. 13/035,534, filed on Feb. 25, 2011, now Pat. No. 9,348,339.
(Continued)

(51) Int. Cl.
*C23C 16/455* (2006.01)
*G05D 7/06* (2006.01)
*G01F 1/72* (2006.01)

(52) U.S. Cl.
CPC ..... *G05D 7/0635* (2013.01); *C23C 16/45523* (2013.01); *C23C 16/45557* (2013.01); *G01F 1/72* (2013.01); *Y10T 137/8593* (2015.04)

(58) Field of Classification Search
CPC ............ G05D 7/0635; G05D 7/0623; C23C 16/45557; C23C 16/45523; G01F 1/72; Y10T 137/8593
See application file for complete search history.

(56) References Cited

U.S. PATENT DOCUMENTS 4,783,343 A    11/1988 Sato
4,916,089 A    4/1990 Suchtelen et al.
(Continued)

FOREIGN PATENT DOCUMENTS

CN    101023199    8/2007
CN    101256397 B    5/2012
(Continued)

OTHER PUBLICATIONS

The International Search Report and the Written Opinion of the International Searching Authority from Corresponding PCT Application No. PCT/US2012/026519 dated Jun. 18, 2012.
(Continued)

*Primary Examiner* — Yuechuan Yu
(74) *Attorney, Agent, or Firm* — Hamilton, Brook, Smith & Reynolds, P.C.

(57) ABSTRACT

A system for delivering pulses of a desired mass of gas to a tool, comprising: a mass flow controller including flow sensor, a control valve and a dedicated controller configured and arranged to receive a recipe of a sequence of steps for opening and closing the control valve so as to deliver as sequence of gas pulses as a function of the recipe. The mass flow controller is configured and arranged so as to operate in either one of at least two modes: as a traditional mass flow controller (MFC) mode or in a pulse gas delivery (PGD) mode. Further, the dedicated controller is configured and arranged to delivery pulses of gas in accordance with anyone of three different types of pulse gas delivery processes: a time based pulse delivery process, a mole based pulse delivery process and a profile based pulse delivery process.

19 Claims, 5 Drawing Sheets

Related U.S. Application Data

(60) Provisional application No. 61/525,452, filed on Aug. 19, 2011.

(56) References Cited

U.S. PATENT DOCUMENTS

| | | | |
|---|---|---|---|
| 5,524,084 A | | 6/1996 | Wang et al. |
| 5,565,038 A | | 10/1996 | Ashley |
| 5,591,061 A | | 1/1997 | Ikeda et al. |
| 5,660,207 A | * | 8/1997 | Mudd ............... 137/599.13 |
| 5,865,205 A | * | 2/1999 | Wilmer ............... 137/2 |
| 6,000,830 A | * | 12/1999 | Asano et al. ............... 700/121 |
| 6,089,537 A | | 7/2000 | Olmsted |
| 6,119,710 A | | 9/2000 | Brown et al. |
| 6,125,869 A | | 10/2000 | Horiuchi |
| 6,269,279 B1 | * | 7/2001 | Todate et al. ............... 700/121 |
| 6,287,980 B1 | * | 9/2001 | Hanazaki et al. ............... 438/726 |
| 6,405,745 B1 | | 6/2002 | Kar et al. |
| 6,503,330 B1 | | 1/2003 | Sneh et al. |
| 6,631,334 B2 | | 10/2003 | Grosshart |
| 6,638,859 B2 | | 10/2003 | Sneh et al. |
| 6,820,632 B2 | | 11/2004 | Ohmi |
| 6,911,092 B2 | | 6/2005 | Sneh |
| 6,913,031 B2 | | 7/2005 | Nawata et al. |
| 7,369,959 B2 | | 5/2008 | Evans |
| 7,428,373 B2 | | 9/2008 | Sandhu |
| 7,474,968 B2 | | 1/2009 | Ding et al. |
| 7,615,120 B2 | | 11/2009 | Ali et al. |
| 7,628,860 B2 | | 12/2009 | Shajii et al. |
| 7,628,861 B2 | | 12/2009 | Clark |
| 7,662,233 B2 | | 2/2010 | Sneh |
| 7,735,452 B2 | | 6/2010 | Spartz |
| 7,794,544 B2 | | 9/2010 | Nguyen et al. |
| 7,829,353 B2 | | 11/2010 | Shajii et al. |
| 8,297,223 B2 | | 10/2012 | Liu et al. |
| 2002/0007790 A1 | | 1/2002 | Park |
| 2002/0114732 A1 | | 8/2002 | Vyers |
| 2003/0180458 A1 | | 9/2003 | Sneh |
| 2004/0050326 A1 | | 3/2004 | Thilderkvist et al. |
| 2004/0187928 A1 | | 9/2004 | Ambrosina et al. |
| 2004/0230113 A1 | | 11/2004 | Bolam et al. |
| 2004/0244837 A1 | | 12/2004 | Nawata |
| 2005/0081787 A1 | | 4/2005 | Im et al. |
| 2005/0103264 A1 | | 5/2005 | Jansen |
| 2005/0160983 A1 | | 7/2005 | Sneh |
| 2005/0196533 A1 | | 9/2005 | Hasebe et al. |
| 2005/0207943 A1 | | 9/2005 | Puzey |
| 2005/0223979 A1 | | 10/2005 | Shajii et al. |
| 2005/0249876 A1 | | 11/2005 | Kawahara et al. |
| 2005/0282365 A1 | * | 12/2005 | Hasebe et al. ............... 438/513 |
| 2006/0032442 A1 | | 2/2006 | Hasebe |
| 2006/0060139 A1 | | 3/2006 | Meneghini et al. |
| 2006/0130744 A1 | * | 6/2006 | Clark ............... C23C 16/45544 117/86 |
| 2006/0130755 A1 | | 6/2006 | Clark |
| 2006/0207503 A1 | | 9/2006 | Meneghini et al. |
| 2007/0026540 A1 | | 2/2007 | Nooten et al. |
| 2007/0039549 A1 | | 2/2007 | Shajii et al. |
| 2007/0039550 A1 | | 2/2007 | Shajii et al. |
| 2007/0204702 A1 | | 9/2007 | Melcer et al. |
| 2007/0240778 A1 | | 10/2007 | L'Bassi et al. |
| 2008/0086229 A1 | | 4/2008 | Ueda et al. |
| 2008/0095936 A1 | | 4/2008 | Senda et al. |
| 2008/0097640 A1 | * | 4/2008 | Cho et al. ............... 700/121 |
| 2008/0167748 A1 | | 7/2008 | Ding |
| 2009/0004836 A1 | | 1/2009 | Singh et al. |
| 2009/0008369 A1 | | 1/2009 | Nozawa et al. |
| 2009/0018692 A1 | * | 1/2009 | Yoneda ............... 700/121 |
| 2009/0163040 A1 | | 6/2009 | Maeda et al. |
| 2009/0248213 A1 | | 10/2009 | Gotoh |
| 2010/0125424 A1 | | 5/2010 | Ding et al. |
| 2010/0305899 A1 | | 12/2010 | Czompo et al. |
| 2011/0033956 A1 | | 2/2011 | Miller |
| 2011/0174219 A1 | | 7/2011 | Meneghini |
| 2012/0073672 A1 | | 3/2012 | Ding |
| 2012/0076935 A1 | | 3/2012 | Ding |
| 2012/0216888 A1 | | 8/2012 | Ding et al. |
| 2013/0025786 A1 | | 1/2013 | Davidkovich |
| 2013/0186322 A1 | | 7/2013 | Hirose et al. |
| 2019/0056755 A1 | | 2/2019 | Ding et al. |

FOREIGN PATENT DOCUMENTS

| | | |
|---|---|---|
| CN | 202677205 U | 1/2013 |
| CN | 103328936 A | 9/2013 |
| CN | 103597325 A | 2/2014 |
| DE | 102004015174 | 10/2005 |
| EP | 0969342 | 1/2000 |
| EP | 2006414 | 12/2008 |
| JP | 61229319 | 10/1986 |
| JP | 06045256 | 2/1994 |
| JP | 2000012454 | 1/2000 |
| JP | 2000200780 | 7/2000 |
| JP | 2002329674 | 11/2002 |
| JP | 2006222141 | 8/2006 |
| JP | 2007535617 | 12/2007 |
| JP | 2008091625 | 4/2008 |
| JP | 2009530737 | 8/2009 |
| JP | 2009245132 | 10/2009 |
| KR | 1020070012465 | 1/2007 |
| KR | 1020090104678 | 10/2009 |
| TW | I223056 B | 11/2004 |
| TW | 201134978 A | 10/2011 |
| WO | 02073329 | 9/2002 |
| WO | 2005/103328 | 11/2005 |
| WO | 2007108871 | 9/2007 |
| WO | WO 2008/112423 | 9/2008 |
| WO | 2011090825 A1 | 7/2011 |

OTHER PUBLICATIONS

Office Action dated Jul. 2, 2014 from Corresponding Chinese Application No. 201180056074.1.

Office Action dated Apr. 2, 2014 from Corresponding Japanese Application No. 2013-531758.

Office Action dated Apr. 2, 2014 from Corresponding Japanese Application No. 2013-531756.

English Version of the Search Report dated Jan. 11, 2014 from Corresponding Taiwan Patent Application No. 100135295.

Taiwan Version of Office Action dated Jan. 22, 2014 from Corresponding Taiwan Patent Application No. 100135295.

Office Action dated Nov. 24, 2014 from corresponding German Application No. 112011103330.3.

Office Action dated Nov. 27, 2014 from corresponding German Application No. 112011103337.0.

International Search Report and the Written Opinion from corresponding PCT/US2011/053618 dated Jan. 16, 2012.

International Search Report and the Written Opinion from corresponding PCT/US2011/053614 dated Dec. 9, 2011.

International Search Report and the Written Opinion dated Jun. 24, 2015 from corresponding PCT Application No. PCT/US2015/015363.

Final Office Action dated Jul. 13, 2015 from corresponding U.S. Appl. No. 13/035,534.

Final Office Action received in U.S. Appl. No. 14/209,216, dated Nov. 30, 2017; 14 pages.

Final Office Action received in U.S. Appl. No. 14/269,778, dated Nov. 17, 2017; 14 pages.

Extended European Search Report received in European Application No. 15760881.1, dated Oct. 26, 2017; 5 pages.

* cited by examiner

SYSTEM FOR AND METHOD OF FAST PULSE GAS DELIVERY

CROSS-REFERENCE TO RELATED APPLICATIONS

Reference is made to U.S. patent application Ser. No. 12/893,554, entitled SYSTEM FOR AND METHOD OF FAST PULSE GAS DELIVERY, filed Sep. 29, 2010 in the name of Junhua Ding, and assigned to the present assignee; U.S. patent application Ser. No. 13/035,534, entitled METHOD AND APPARATUS FOR MULTIPLE-CHANNEL PULSE GAS DELIVERY SYSTEM, filed Feb. 25, 2011 in the name of Junhua Ding and assigned to the present assignee, and U.S. patent application Ser. No. 13/193,393, entitled Systems and Methods of Controlling Time-Multiplexed Deep Reactive-Ion Etching Processes, filed Jul. 28, 2011 in the name of Vladislav Davidkovich et al. and assigned to the present assignee, all applications being incorporated herein in their entirety. All of these applications are referred to hereinafter as the "Copending Applications".

This application is a continuation-in-part of copending U.S. patent application Ser. No. 13/035,534, entitled METHOD AND APPARATUS FOR MULTIPLE-CHANNEL PULSE GAS DELIVERY SYSTEM, filed Feb. 25, 2011 in the name of Junhua Ding and assigned to the present assignee; and claims priority from U.S. Provisional Patent Application No. 61/525,452, entitled SYSTEM AND METHOD OF FAST PULSE GAS DELIVERY, filed Aug. 19, 2011 in the names of Junhua Ding, Michael L'Bassi and Tseng-Chung Lee and assigned to the present assignee.

BACKGROUND

Field

This disclosure relates generally to mole or gas delivery devices, and more particularly, to a method of and system for pulse gas delivery. As used herein the term "gas" includes the term "vapor(s)" should the two terms be considered different.

Overview

The manufacture or fabrication of semiconductor devices often requires the careful synchronization and precisely measured delivery of as many as a dozen gases to a process tool. For purposes herein, the term "process tool" may or may not include a process chamber. Various recipes are used in the manufacturing process, involving many discrete process steps, where a semiconductor device is typically cleaned, polished, oxidized, masked, etched, doped, metalized, etc. The steps used, their particular sequence, and the materials involved all contribute to the making of particular devices.

As device sizes have shrunk below 90 nm, one technique known as atomic layer deposition, or ALD, continues to be required for a variety of applications, such as the deposition of barriers for copper interconnects, the creation of tungsten nucleation layers, and the production of highly conducting dielectrics. In the ALD process, two or more precursor gases are delivered in pulses and flow over a wafer surface in a process tool maintained under vacuum. The two or more precursor gases flow in an alternating or sequential manner so that the gases can react with the sites or functional groups on the wafer surface. When all of the available sites are saturated from one of the precursor gases (e.g., gas A), the reaction stops and a purge gas is used to purge the excess precursor molecules from the process tool. The process is repeated, as the next precursor gas (i.e., gas B) flows over the wafer surface. For a process involving two precursor gases, a cycle can be defined as one pulse of precursor A, purge, one pulse of precursor B, and purge. A cycle can include the pulses of additional precursor gases, as well as repeats of a precursor gas, with the use of a purge gas in between successive pulses of precursor gases. This sequence is repeated until a final geometric characteristic, such as thickness, is reached. These sequential, self-limiting surface reactions result in one monolayer of deposited film per cycle.

The delivery of pulses of precursor gases introduced into a process tool can be controlled using a pulse gas delivery (PGD) device (the controlled flow of gas into and out of a delivery chamber using inlet and outlet on/off-type valves simply the timing of the opening of the outlet shutoff valve for a predetermined period of time (pulse) to deliver a desired amount (mass) of precursor gas into the process chamber of the process tool). Alternatively, a mass flow controller ("MFC"), which is a self-contained device comprising a transducer, control valve, and control and signal-processing electronics, has been used to deliver an amount of gas at predetermined and repeatable flow rates, in short time intervals.

Pulse gas delivery (PGD) devices are usually pressure based and optimized to provide repeatable and precise quantities (mass) of gases for use in semiconductor manufacturing processes, such as ALD processes. Typically, as shown in FIG. 1, current PGD devices include a delivery gas chamber 12, an inlet shut off valve 14 for controlling the flow of gas from a gas supply 52 into chamber 12, and an outlet shut off valve 16 for controlling the flow of gas from the delivery chamber 12 to the process tool 54. A host controller or computer 50 runs the gas delivery process as well as carries out all of the control and diagnostic functions for the process tool, including, for example, safety monitoring and control, RF power signals, and other common tasks. Since the volume of the delivery chamber 12 is fixed and known, the amount of gas, measured in moles, introduced into the delivery chamber with each pulse is a function of the gas type, the temperature of the gas in the chamber, and the pressure drop of the gas during the duration of the pulse delivered from the chamber 12. Accordingly, pressure sensor 18 and temperature sensor 20 provide measurements of the pressure and temperature to the controller 24 so that the gas delivered from the chamber during each pulse can be determined. The control logic for running the PGD device has thus been traditionally and typically on the host controller 50 associated with the process tool. Improvements are described in the copending Applications by providing a dedicated controller 24 for separately controlling the pulse delivery process by operation of the inlet and outlet valves 14 and 16.

More recently, certain processes have been developed that require high speed pulsed or time-multiplexed processing. For example, the semiconductor industry is developing advanced, 3-D integrated circuits thru-silicon vias (TSVs) to provide interconnect capability for die-to-die and wafer-to-wafer stacking. Manufacturers are currently considering a wide variety of 3-D integration schemes that present an equally broad range of TSV etch requirements. Plasma etch technology such as the Bosch process, which has been used extensively for deep silicon etching in memory devices and MEMS production, is well suited for TSV creation. The Bosch process, also known as a high speed pulsed or time-multiplexed etching, alternates repeatedly between two modes to achieve nearly vertical structures using $SF_6$ and the deposition of a chemically inert passivation layer using $C_4F_8$. Targets for TSV required for commercial success are adequate functionality, low cost, and proven reliability.

These high speed processes require fast response times during the transition time of the pulses in order to better control the processes, making the use of pressure based pulse gas delivery devices problematic. Currently, one approach to increase response time is to use a fast response mass flow controller (MFC) to turn on and off gas flows of the delivery pulse gases delivered to the process tool according to signals received from a host controller. The repeatability and accuracy of pulse delivery using a fast response MFC with a host controller, however, leaves room for improvement, because response times are dependent on the workload of the host controller. The host controller may be prevented from sending timely control signals if it is performing other functions that require its attention. Further, with short duration control signals being sent from the host controller to the mass flow controller, communication jitter can occur causing errors in the delivery of pulses of gas. Workload of the host controller and communication jitter are two sources of error that reduce the repeatability and accuracy of pulse gas delivery when relying to fast communication between the host controller and the mass flow controller delivering pulses of gas.

DESCRIPTION OF RELATED ART

Examples of pulse mass flow delivery systems can be found in U.S. Pat. Nos. 7,615,120; 7,615,120; 7,628,860; 7,628,861, 7,662,233; 7,735,452 and 7,794,544; U.S. Patent Publication Nos. 2006/0060139; and 2006/0130755, and pending U.S. application Ser. No. 12/689,961, entitled CONTROL FOR AND METHOD OF PULSED GAS DELIVERY, filed Jan. 19, 2010 in the name of Paul Meneghini and assigned the present assignee; and U.S. patent application Ser. No. 12/893,554, entitled SYSTEM FOR AND METHOD OF FAST PULSE GAS DELIVERY, filed Sep. 29, 2010 in the name of Junhua Ding, and assigned to the present assignee; and U.S. patent application Ser. No. 13/035,534, entitled METHOD AND APPARATUS FOR MULTIPLE-CHANNEL PULSE GAS DELIVERY SYSTEM, filed Feb. 25, 2011 in the name of Junhua Ding and assigned to the present assignee.

SUMMARY

As discussed above, workload of a host controller and communication jitter reduce the repeatability and accuracy of pulse gas delivery. Hence, by reducing the workload of the host controller and moving control signals from the host to the controller of the MFC, these two factors are reduced, resulting in improved repeatability and accuracy of the gas pulse delivery.

These, as well as other components, steps, features, objects, benefits, and advantages, will now become clear from a review of the following detailed description of illustrative embodiments and the accompanying drawings.

BRIEF DESCRIPTION OF DRAWINGS

The drawings disclose illustrative embodiments. They do not set forth all embodiments. Other embodiments may be used in addition or instead. Details which may be apparent or unnecessary may be omitted to save space or for more effective illustration. Conversely, some embodiments may be practiced without all of the details which are disclosed. When the same numeral appears in different drawings, it refers to the same or like components or steps.

DETAILED DESCRIPTION OF ILLUSTRATIVE EMBODIMENTS

Illustrative embodiments are now discussed. Other embodiments may be used in addition or instead. Details which may be apparent or unnecessary may be omitted to save space or for a more effective presentation. Conversely, some embodiments may be practiced without all of the details which are disclosed.

Figure 2:
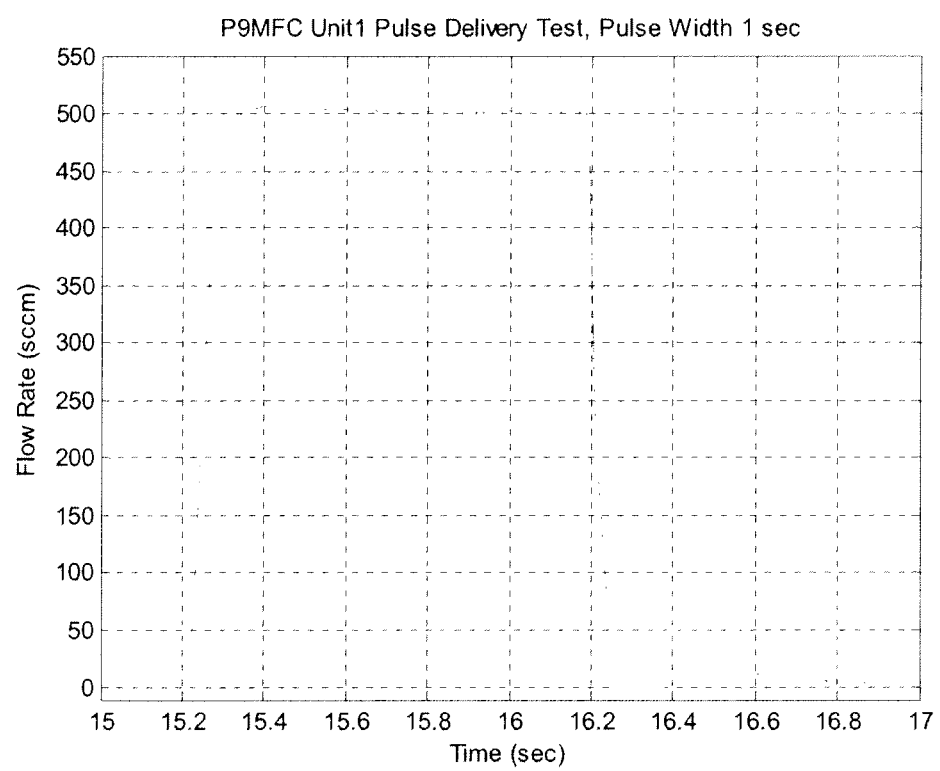
FIG. 2 are graphical representations of a test gas pulse illustrating the flow rate over time.

An experiment was conducted using a test set-up for analyzing fast gas pulse delivery using a fast response MFC controlled by a host computer in order to illustrate the steepness of the transient edges of each pulse of gas delivered from the MFC as a measure of the response of the MFC going from zero flow to full flow and from full flow to zero flow. Each pulse of gas delivered by the MFC was controlled with a host computer, which included a sequence of delivery steps typical of a recipe. One pulse produced by a fast response MFC during the delivery phase is shown in FIG. 2. As shown the transient edges of the gas pulse (flow rate vs. time) is fairly steep indicating quick response times of the control valve of the MFC. In analyzing the results of the experiment, however, the performance suffered making the system unreliable for high speed processes such as the Bosch process.

More specifically, the experiment used a mass flow verifier to measure the amount of gas delivered from a fast response MFC controlled by a host computer, and data was generated to determine the repeatability of the system. The pulses of gas that were delivered by the MFC suffered from repeatability errors because of the variations in the timing of the response of the MFC to each pulse relative to the timing of the response to the previous pulse, i.e., repeatability errors with respect to the response of the MFC to a command from the host computer to provide a pulse varying from when it should occur based on the timing of the previous pulse and the time that it actually occurred. It was determined that among the causes for this error is the already high demand for the host controller's resources. Although a host controller may queue an on/off signal to be sent to the MFC, the signal may not be sent immediately, depending on the work load of the host controller at that moment. Similarly, even when an on/off signal is transmitted, communication jitter between the host controller and the MFC caused by a short and/or fast pulse width degrades the performance of the pulse gas delivery, including repeatable and accurate performance. The relative timing of pulses is crucial to the success of many high speed pulse delivery applications. Thus, it is desirable to provide a solution for high speed pulse delivery applications, such as the Bosch process used for TSV creation, that reduces or overcomes these problems.

Figure 3:
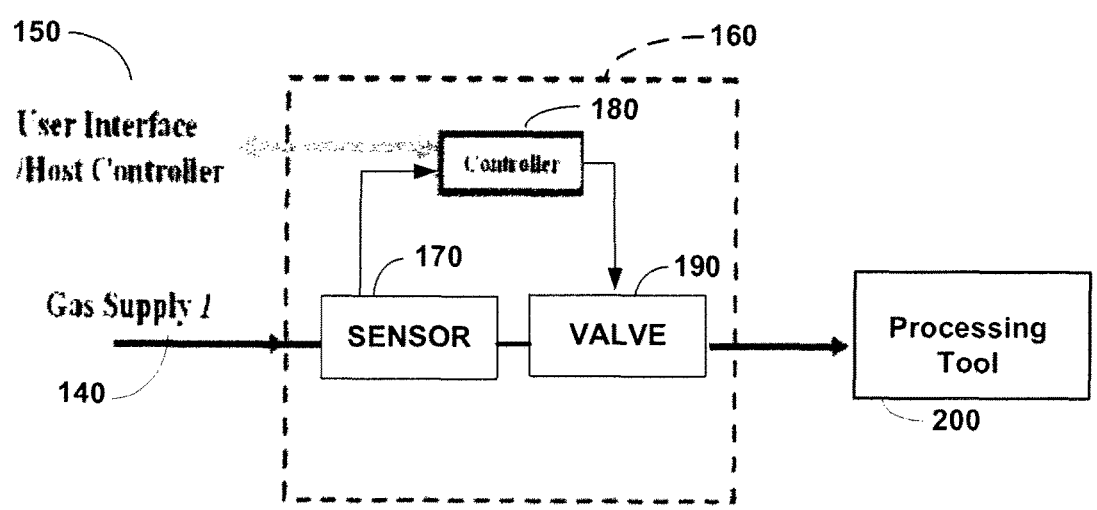
FIG. 3 is an embodiment of a gas delivery system using a high performance MFC and modified according to the teachings described herein.

Referring to FIG. 3, one embodiment of a high performance MFC 160 useful in controlling a high speed pulse delivery application is configured to be connected between a source of gas 140 and a processing tool 200 and to receive a series of instructions from a user interface/host controller 150 so as to provide a series of pulses of source gas to processing tool 200. High performance mass flow controller (MFC) 160, such as a πMFC manufactured and sold by the present assignee, includes a flow sensor 170 and an adjustable control valve 190. The sensor 170 senses the mass flow through the sensor, and provides a signal representative of the measured flow to the dedicated MFC controller 180. The dedicated controller 180 compares the measured flow with a flow set point so as to provide a control signal used to control the adjustable control valve 190 so that the output flow of the valve to the process tool 200, such as a process chamber, is maintained at the set point value.

In one embodiment according to the present disclosure, the MFC 160 has two modes of operation, providing one significant advantage over pressure based pulse gas delivery devices. A first mode is a traditional mass flow controller (MFC) mode, where a host controller 150 sends flow set point signals to the MFC 160 to control the flow delivered to the processing tool 200. A second mode is a pulse gas delivery (PGD) mode. In PGD delivery processes, MFC 160 is arranged to receive the pulse profile and the necessary profile and sequencing of pulses so that the MFC can deliver a gas from the supply 140 to the chamber 200 in accordance with a recipe including a profile and sequence of timed pulses provided by the user. The profile and sequencing of the pulses can be initially programmed by the information being downloaded from the user interface/host controller 150 to the dedicated MFC controller 180. The downloaded profile and sequencing allows the MFC to carry out all of the sequencing steps in response to a single trigger signal from the interface/controller 150. Using a dedicated MFC 160, the dedicated controller can be configured and arranged so as to carry out all of the sequencing steps in a well controlled and timely manner, freeing the host controller/interface to carry out all of its other functions without interfering with the pulse gas delivery.

The PGD mode provides operational steps for three delivery types of pulse gas delivery processes—time based delivery, mole based delivery, and profile based delivery providing a further advantage over the pressure based gas pulse delivery devices. In the time based pulse delivery process, the user is required to configure and arrange the dedicated MFC controller 180 the following parameters for the process that is to be controlled: (1) at least one targeted flow set point ($Q_{sp}$), (2) at least one time length of the pulse-on period ($T_{on}$), (3) at least one time length of each pulse-off period ($T_{off}$), and (4) the total number of pulses (N) required to complete the process.

Figure 4:
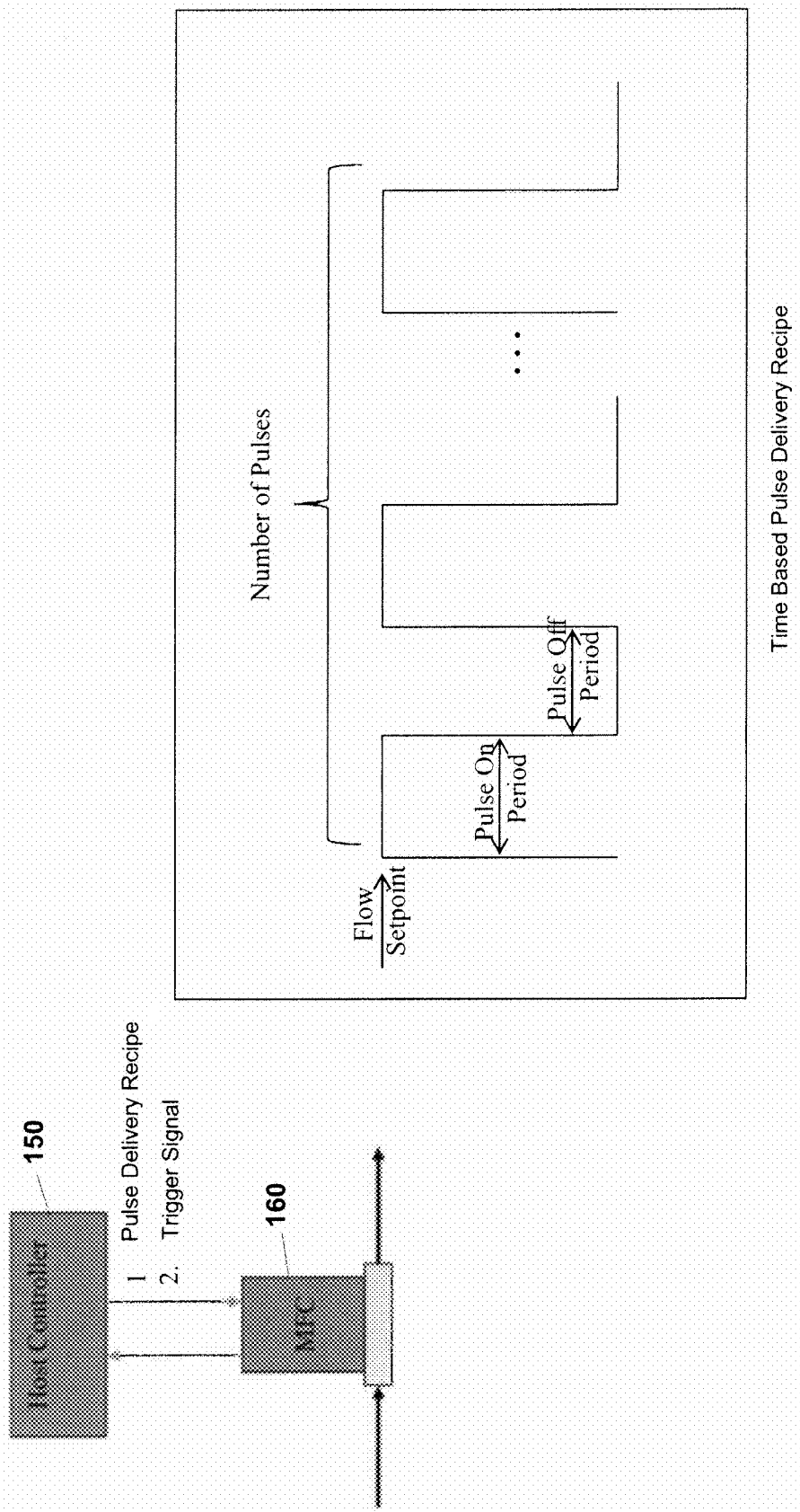
FIG. 4 illustrates a typical time based pulse gas delivery profile downloaded to the MFC so that the MFC can deliver a series of gas pulses without the need to interact with the host controller, and thus operate freely of the host controller overhead functions.

As shown in FIG. 4, the parameters are configured or downloaded from the host controller to the dedicated MFC controller of the MFC so that the MFC controller controls the pulse delivery as a function of these parameters. When the pulse gas delivery sequence is to be delivered, the host computer simply provides a trigger signal to the MFC, and the MFC carries out the sequence of pulses. As shown in FIG. 4, once the MFC 160 receives the trigger signal from the host controller 150 to start delivery, the MFC 160 controls the PGD process according to the recipe by turning the MFC on (controlling the flow to the targeted flow set point by regulating the openness of the valve) and off (controlling the flow to zero by closing the valve) based on the prescribed pulse on period and the pulse off period for each pulse period. This results in very good control of the sequencing, timing and duration of the pulses.

For mole based pulse delivery, a user specifies the following parameters: (1) mole delivery set point ($n_{sp}$), (2) the targeted time length of the pulse-on period ($T_{on}$), (3) the total pulse on and off period ($T_{total}$), and (4) the number of pulses (N). Based on this information, the dedicated controller 180 of MFC 160 is configured and arranged so as to automatically adjust the flow set point and the pulse-on period to precisely deliver within the targeted pulse-on period the targeted mole amount of gas based on measurements taken by a flow sensor 170, according to the following equation:

$$\Delta n = \int_{t1}^{t2} Q \cdot dt$$

wherein Δn is the number of moles of gas delivered during the pulse-on period (between times t1 and t2); and Q is the flow rate measured by sensor 170 of the MFC 160 during the pulse-on period.

Thus, using the mole based pulse delivery mode, the MFC controls, and adjusts as necessary, the flow setpoint and the actual pulse-on period so as to control the number of moles delivered with each pulse. Based on these parameters, the MFC 160 automatically delivers N pulses of flow in a precise timing sequence, with each pulse delivering Δn moles during the portion of each total pulse period that the MFC is on, and turning the MFC off for the remainder of the total pulse on and off period ($T_{total}$). During operation of the mole based pulse delivery operation, the MFC 160 will automatically adjust the flow set point (Qsp) and the actual pulse-on period based on the feedback of the previous delivery in order to precisely deliver the desired number of moles within the targeted pulse-on period ($T_{on}$) for each pulse.

Mole based delivery is preferred (but not required) when multiple process tools are being used or flow to different parts of a process tool are required to be matched. In such a case multiple high performance MFCs are used to provide flow through the corresponding multiple delivery channels. To ensure that mole delivery is accurate, each MFC 160 uses feedback control loop from its flow sensor 170 to control its valve 190. Thus, when multiple delivery channels are used, there may be variations in response time, valve conductance, etc. In such a case mole based pulse delivery can be used to ensure that the amount (moles) of gas delivered with each pulse in each delivery channel is the same, regardless of these factors, since mole delivery will be independent of these factors. In one embodiment, feedback is used to correct the errors in the amount of gas delivered caused by valve response times.

It is contemplated that other parameters or other combinations of parameters may be used to control gas delivery. For example, for time based delivery an off flow set point can be entered for delivery of gas during the $T_{off}$ period, instead of defaulting to zero.

Repeatability and accuracy are improved by both time based and mole based delivery method using the dedicated controller of a MFC because the PGD control responsibility has been taken away from the host controller 150 (reducing delays due to work load) and because the signal transmission is closer to (and in fact within) the MFC 160 (reducing communication jitter).

Figure 1:
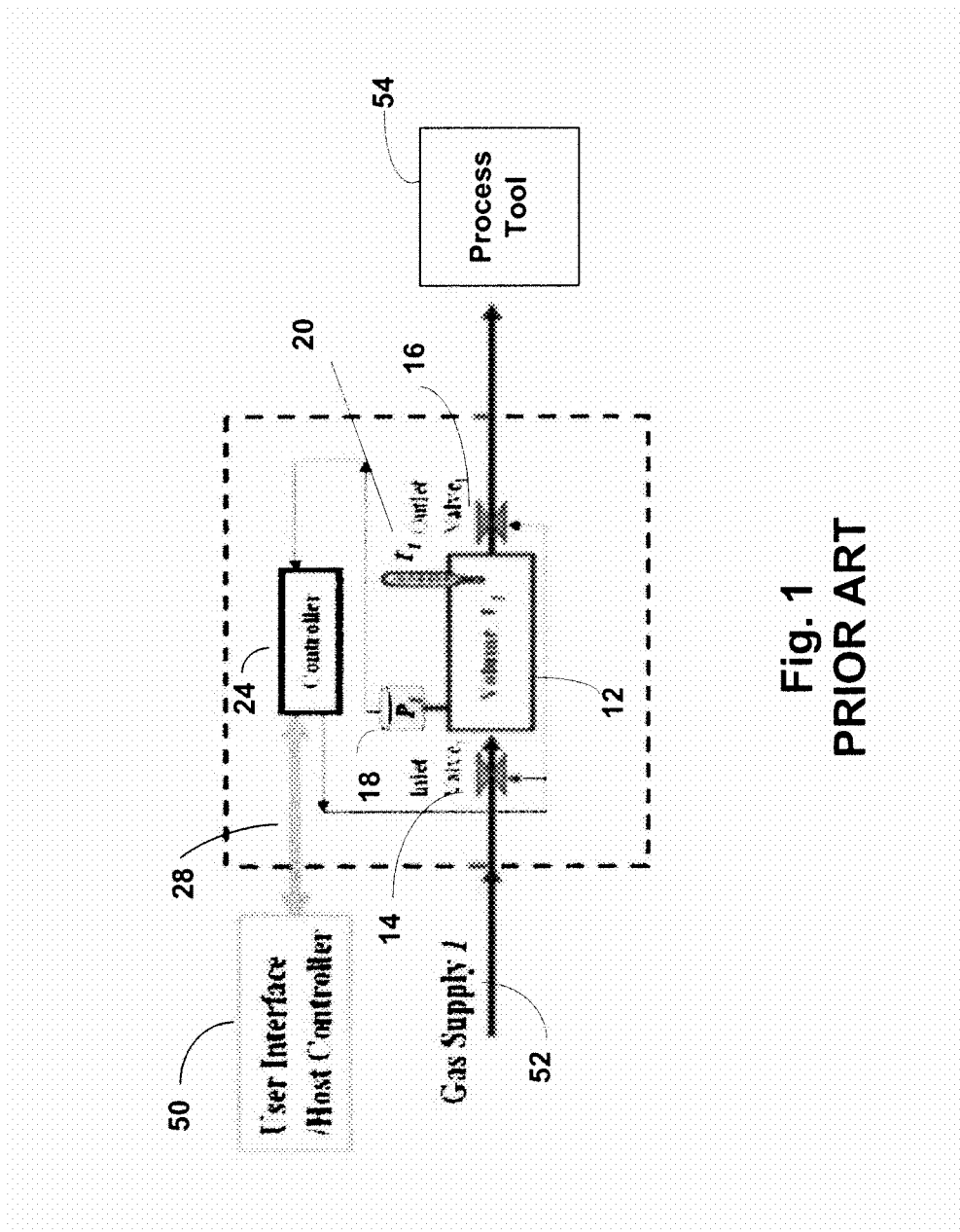
FIG. 1 is a block diagram of a prior art gas delivery system for providing high speed pulse delivery.
Figures 5A, 5B:
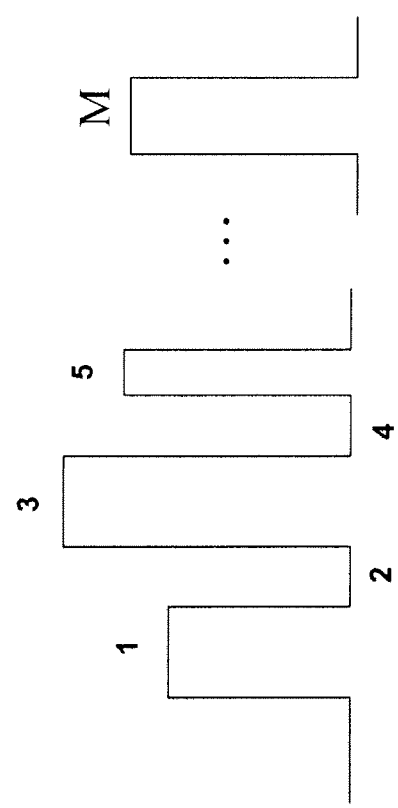
FIGS. 5A and 5B are examples of sets of profiles of M pulses for configuring the MFC controller so that the MFC controller can automatically deliver, in response to a trigger signal from the host controller, the M-pulse profile by turning on and off itself so as to generate the pulses in the sequence dictated by the recipe downloaded by the host computer.

Finally, the third mode of operation is the profile pulse mode. In one embodiment of the profile pulse type of delivery, a user creates a profile characterizing one or more pulses. For each pulse in the profile, the user specifies the flow set point and the corresponding on and off pulse period, i.e., (1) the flow set point $Q_{sp1}$ and a corresponding first pulse on and off period ($T_{on1}$ $T_{off1}$), (2) the flow set point $Q_{sp2}$ and a corresponding second pulse on and off period ($T_{on2}$ $T_{off2}$), . . . (m) the flow set point $Q_{spm}$ and a corresponding m-th pulse on and off period ($T_{onm}$ $T_{offm}$), etc. Thus, a set of parameters are provided for each pulse of the entire set of pulses, allowing the pulses to vary depending on the type of process being run. FIGS. 5A and 5B illustrate two examples of sets of pulse profiles. While in some embodiments, a user can define an ordinary on/off pulse with varying set points during $T_{on}$ (as seen in FIG. 5A), in other embodiments, the user may enter more than one flow set point for both the on period and off period such that a stair-step type profile can be created as seen in FIG. 5B. The latter is possible because the MFC employs a proportional control valve. Unlike a shutoff/on valve, the proportional control valve can be set at any position between a totally open position and a totally closed position, providing a further advantage over the pressure based PGD device, such as the one shown in FIG. 1. In the profile pulse delivery mode, the user can also specify the mole delivery set point ($n_{spi}$) instead of the flow set point $Q_{spi}$ along with the corresponding pulse on and off period ($T_{oni}$, $T_{offi}$) for each of the pulses in the profile recipe.

Thus, the MFC 160, and not the host controller 150, coordinates the opening and closings operation of the control valve 190 and, accordingly, gas delivery. Historically, MFCs were analog devices incapable of accurately performing such PDG control responsibilities with such relatively short pulses. Newer, digital MFCs, however, are capable of taking on the responsibility of controlling the proportional control valve of the MFC. Given the aforementioned need for faster PGD processes, higher repeatability and accuracy is achieved using the dedicated MFC controller 180 to run the PGD delivery process than would otherwise be possible. Instead of the host controller having to send signals to turn on and off the MFC, the process functions are carried out alone by the MFC 160 of FIG. 3, eliminating a significant amount of hardware while assuring more accurate delivery. The required control recipe parameters vary based on the type of PGD mode being used, as described in more detail below. The host controller 150 may also send an abort signal to the MFC controller 180 at any time to abort pulse gas delivery. For example, if a safety check fails, the host controller 150 may demand the MFC 160 to immediately stop triggered gas delivery sequencing that is in process. Similarly, if the host controller 150 detects that incorrect gas delivery is being performed, then the host controller 150 may send an abort signal. In this way the host computer 150 can continue to monitor other processes, while the gas delivery steps are dedicated to the dedicated controller 180 of MFC 160.

In various embodiments of the present disclosure, a host controller 150 can be used in conjunction with a plurality of MFCs 160 used with a corresponding number of delivery channels as mentioned above. The host controller 150 sends timely trigger signals to each MFC 160. The host controller 150, thus, can offset trigger signals to sequentially or simultaneously trigger the plurality of MFCs 160. In this configuration, the host controller 150 may stagger the trigger signals so that the delivery channels do not deliver gas simultaneously. For example, suppose control parameters define a $T_{on}$ of 0.25 s and $T_{off}$ of 0.75 s in each of two MFCs 160. If the host controller 150 sends a trigger signal to the second MFC 0.5 s after triggering the first MFC, then the process tool 200 will receive delivery of gas equivalent to a $T_{on}$ of 0.25 s and $T_{off}$ of 0.25 s (if the two gas chambers are filled with the same gas).

Test results using the disclosed approach indicated an improvement in the repeatability error over the experimental approach using a host computer to control the process by two orders of magnitude.

As described, the gas delivery system reliably measures the amount of material (mass) flowing into the semiconductor tool, and provides for accurate delivery of the mass of a gas in pulses of relatively short duration in a reliable and repeatable fashion. Further, the system employs a more simplified operation, while providing delivery of the desired number of moles of gas over a wide range of values, without the need to divert gas to achieve the accurate, reliable and repeatable results.

The components, steps, features, objects, benefits and advantages which have been discussed are merely illustrative. None of them, nor the discussions relating to them, are intended to limit the scope of protection in any way. Numerous other embodiments are also contemplated. These include embodiments which have fewer, additional, and/or different components, steps, features, objects, benefits and advantages. These also include embodiments in which the components and/or steps are arranged and/or ordered differently.

Unless otherwise stated, all measurements, values, ratings, positions, magnitudes, sizes, and other specifications which are set forth in this specification, including in the claims which follow, are approximate, not exact. They are intended to have a reasonable range which is consistent with the functions to which they relate and with what is customary in the art to which they pertain.

All articles, patents, patent applications, and other publications which have been cited in this disclosure are hereby incorporated herein by reference.

The phrase "means for" when used in a claim is intended to and should be interpreted to embrace the corresponding structures and materials which have been described and their equivalents. Similarly, the phrase "step for" when used in a claim is intended to and should be interpreted to embrace the corresponding acts which have been described and their equivalents. The absence of these phrases in a claim mean that the claim is not intended to and should not be interpreted to be limited to any of the corresponding structures, materials, or acts or to their equivalents.

Nothing which has been stated or illustrated is intended or should be interpreted to cause a dedication of any component, step, feature, object, benefit, advantage, or equivalent to the public, regardless of whether it is recited in the claims.

The scope of protection is limited solely by the claims which now follow. That scope is intended and should be interpreted to be as broad as is consistent with the ordinary meaning of the language which is used in the claims when interpreted in light of this specification and the prosecution history which follows and to encompass all structural and functional equivalents.

What is claimed is:

1. A system for delivering pulses of a desired mass of gas to a tool as a complete recipe of mass flows, the system comprising:
a mass flow controller including a flow sensor, an adjustable control valve and a dedicated controller, wherein, prior to delivery of the complete recipe of mass flows that defines mass flows to be controlled by the adjustable control valve during each of the pulses, the dedicated controller is configured to receive the complete recipe including a sequence of steps for opening and closing the adjustable control valve repeatedly so as to deliver a sequence of gas pulses as a function of the recipe, wherein the complete recipe includes a sequence of a number of pulses of gas delivered for a particular gas at a particular step in a semiconductor fabrication process, and wherein the dedicated controller is operative to, in response to a trigger signal, open and close the adjustable control valve repeatedly and, using feedback control from the flow sensor, tune the flow through the adjustable control valve while the control valve is open and thereby deliver mass flow according to all of the steps of the complete recipe.

2. A system according to claim 1, further including a host controller, wherein the host controller provides the trigger signal.

3. A system according to claim 2, wherein the host controller is configured and arranged to upload the recipe to the dedicated controller.

4. A system according to claim 2, further including a plurality of said mass flow controllers for delivery of a plurality of sets of pulses of gas in response to a plurality of trigger signals, respectively.

5. A system according to claim 4, wherein the host controller is configured to stagger the trigger signals to a plurality of said mass flow controllers so that the pulse delivery of these devices are in time-multiplexed way.

6. A system according to claim 1, wherein the mass flow controller operates in one of at least two modes of operation.

7. A system according to claim 6, wherein in one of the modes the mass flow controller is configured and arranged so as to operate as a traditional mass flow controller (MFC) mode receiving flow set point signals as a part of said recipe so as to control the flow rate of gas delivered to a processing tool.

8. A system according to claim 6, wherein in one of the modes the mass flow controller is configured and arranged so as to operate in a pulse gas delivery (PGD) mode.

9. A system according to claim 8, wherein in the PGD mode the mass flow controller is configured and arranged so as to receive a pulse profile and the necessary sequencing of pulses so that the mass flow controller can deliver a gas from a supply to a process tool in accordance with a recipe including a profile and sequence of timed pulses provided by a user.

10. A system according to claim 9, wherein the dedicated controller is programmed with the profile and sequencing of the pulses in response to information downloaded or configured from a host controller to the dedicated controller.

11. A system according to claim 10, wherein the information downloaded or configured from the host controller to the dedicated controller allows the mass flow controller to carry out all of the sequencing steps in response to a single trigger signal received from the host controller.

12. A system according to claim 1, wherein the dedicated controller is configured and arranged so as to carry any one of at least three different types of pulse gas delivery processes.

13. A system according to claim 12, wherein the three different types of pulse gas delivery processes include a time based delivery process, a mole based delivery process and a profile based delivery process.

14. A system according to claim 1, wherein when configured to deliver gas in accordance with a time based delivery process, the dedicated controller is configured and arranged by the user to include the following parameters for the time based delivery process: (1) at least one targeted flow set point ($Q_{sp}$), (2) at least one time length of the pulse-on period ($T_{on}$), (3) at least one time length of each pulse-off period ($T_{off}$), and (4) the total number of pulses (N) required to complete the whole pulse gas delivery process.

15. A system according to claim 1, wherein the dedicated controller is configured and arranged by the user to include the following parameters for a mole based delivery process: (1) at least one mole delivery set point ($n_{sp}$), (2) at least one target time length of pulse-on period ($T_{on}$), (3) at least one time length of total pulse on and off period ($T_{total}$), and (3) the number of pulses (N) to be delivered, so that the dedicated controller is configured and arranged so as to automatically adjust the mole delivery set point and the pulse-on period so as to precisely deliver within the targeted pulse-on period the targeted mole amount of gas based on measurements taken by the flow sensor and the feedback of previous delivery amounts.

16. A system according to claim 1, wherein the dedicated controller is configured to control flow through the adjustable control valve for mole based delivery wherein gas is delivered in accordance with the following equation:

$$\Delta n = \int_{t1}^{t2} Q \cdot dt$$

wherein wherein $\Delta n$ is the number of moles of gas delivered during a pulse-on period (between times t1 and t2); and Q is the flow rate measured by the flow sensor during the pulse-on period.

17. A system according to claim 1, wherein when configured to deliver gas in accordance with a profile based delivery process, the dedicated controller is configured and arranged by a user to include a set of parameters for each pulse of the profile based delivery process depending on the type of process being run.

18. A system according to claim 1, wherein when configured to deliver gas in accordance with a profile based delivery process, the dedicated controller is configured and arranged by a user to include the following parameters for each pulse of the profile based delivery process: (1) the flow set point $Q_{sp1}$ and a corresponding first pulse on and off period ($T_{on1}$ $T_{off1}$), (2) the flow set point $Q_{sp2}$ and a corresponding second pulse on and off period ($T_{on2}$ $T_{off2}$), . . . (m) the flow set point $Q_{spm.}$ and a corresponding m-th pulse on and off period ($T_{onm}$ $T_{offm}$), such that a set of parameters is provided for each pulse of the entire set of pulses, allowing the pulses to vary depending on the type of process being run.

19. A system according to claim 1, wherein when configured to deliver gas in accordance with a profile based delivery process, the dedicated controller is configured and arranged by a user to include the following parameters for each pulse of the profile based delivery process: (1) the mole delivery set point ($n_{sp1}$) and a corresponding first pulse on and off period ($T_{on1}$ $T_{off1}$), (2) the mole delivery set point ($n_{sp2}$) and a corresponding second pulse on and off period ($T_{on2}$ $T_{off2}$), . . . (m) the mole delivery set point ($n_{spm}$) and a corresponding m-th pulse on and off period ($T_{onm}$ $T_{offm}$).

\* \* \* \* \*